(12) United States Patent
Kumar et al.

(10) Patent No.: US 9,412,424 B2
(45) Date of Patent: Aug. 9, 2016

(54) NOISE TOLERANT SENSE CIRCUIT (71) Applicant: STMicroelectronics International N.V., Amsterdam (NL)

(72) Inventors: Ashish Kumar, Ranchi (IN); Manish Umedlal Patel, Greater Noida (IN)

(73) Assignee: STMICROELECTRONICS INTERNATIONAL N.V., AMSTERDAM (NL)

( * ) Notice: Subject to any disclaimer, the term of this patent is extended or adjusted under 35 U.S.C. 154(b) by 0 days.

(21) Appl. No.: 14/107,982

(22) Filed: Dec. 16, 2013

(65) Prior Publication Data
US 2014/0286116 A1    Sep. 25, 2014

Related U.S. Application Data

(63) Continuation of application No. 12/643,520, filed on Dec. 21, 2009, now Pat. No. 8,625,372.

(30) Foreign Application Priority Data

Dec. 24, 2008    (IN) .......................... 2935/DEL/2008

(51) Int. Cl.
G11C 7/00    (2006.01)
G11C 7/06    (2006.01)
G11C 8/12    (2006.01)

(52) U.S. Cl.
CPC  *G11C 7/00* (2013.01); *G11C 7/065* (2013.01); *G11C 8/12* (2013.01); *G11C 2207/005* (2013.01)

(58) Field of Classification Search
USPC ........................................... 365/205
See application file for complete search history.

(56) References Cited

U.S. PATENT DOCUMENTS

| 6,721,220 | B2 * | 4/2004 | Yoon et al. .................... 365/205 |
| 7,072,235 | B2 | 7/2006 | Casper et al. |
| 7,701,785 | B2 * | 4/2010 | Sanjeevarao et al. ..... 365/189.09 |
| 2003/0218911 | A1 * | 11/2003 | Terzioglu et al. ........ 365/185.28 |
| 2006/0077740 | A1 * | 4/2006 | Lee et al. ...................... 365/210 |
| 2008/0198666 | A1 | 8/2008 | Nygren |
| 2009/0003107 | A1 | 1/2009 | Riho et al. |

* cited by examiner

*Primary Examiner* — Anthan Tran
(74) *Attorney, Agent, or Firm* — Allen, Dyer, Doppelt, Milbrath & Gilchrist, P.A.

(57) ABSTRACT

A device and a method for a sense circuit have been disclosed. In an implementation, the sense circuit includes a sense amplifier and at least one decoupling device. The decoupling device is coupled to the sense amplifier through at least one reference line. The sense amplifier reads a data value and the decoupling device decouples the sense amplifier from a power supply during a read operation.

6 Claims, 4 Drawing Sheets

NOISE TOLERANT SENSE CIRCUIT

RELATED APPLICATIONS

The present application is a continuation of and claims the benefit of U.S. Ser. No. 12/643,520, filed Dec. 21, 2009, and claims priority of Indian Patent Application No. 2935/DEL/2008 filed Dec. 24, 2008, both of which are incorporated herein in their entirety by this reference.

FIELD OF THE INVENTION

The subject matter described herein, in general, relates to a sense circuit for a memory and, in particular, relates to a noise tolerant sense circuit.

RELEVANT BACKGROUND

Memory, for example, static random access memory (SRAM) or read only memory (ROM), includes a number of memory cells. A memory cell is coupled to a word line and to one or more bit lines and can store one bit of data. The bit lines coupled to the memory cells are called primary bit lines. The primary bit lines are coupled to pass transistors and undergo various levels of multiplexing to provide multiplexed bit lines, called secondary bit lines.

Generally, the multiplexed or secondary bit lines are coupled to two sensing nodes of a sense amplifier such as a single-ended sense amplifier and a double-ended sense amplifier. The sense amplifier can be of different types: a balanced sense amplifier and an unbalanced sense amplifier. In case of an unbalanced, single-ended sense amplifier, for example, one sensing node is coupled to a multiplexed bit line, while the other node is directly coupled to a power supply. The sense amplifier determines the difference in voltages on these sensing nodes to read a value of data stored in a memory cell.

In a typical read operation, a particular primary bit line is selected by activating a coupled pass transistor, which is supplied with the power supply. The power supply may get coupled to a multiplexed bit line corresponding to the primary bit line due to the inherent coupling between the pass transistor and the multiplexed bit line. Since such a power-supply coupled bit line, i.e., the multiplexed bit line, and the power supply are coupled to the two sensing nodes of a single-ended sense amplifier, any noise or fluctuation in the power supply can get coupled to these sensing nodes. As a result, an error may get introduced in an output of the single-ended sense amplifier.

A noise or fluctuation in the power supply may occur due to a variety of reasons, for example, due to charging and discharging of components including capacitors and transistors during read and write operations of the memory. To prevent these fluctuations, various methods have been implemented including increasing noise margins of the sense amplifiers, coupling a large capacitor to a power mesh, etc. However, these methods slow down the operation of the sense amplifiers and also impose an additional area penalty, which can become more pronounced for a large number of word lines in a memory.

SUMMARY

This summary is provided to introduce concepts related to a noise tolerant sense circuit, which are further described below in the detailed description. This summary is not intended to identify essential features of the claimed subject matter, nor is it intended for use in determining the scope of the claimed subject matter.

In an implementation, a noise tolerant sense circuit includes a sense amplifier and at least one decoupling device. The decoupling device is coupled to the sense amplifier through at least one reference line. The sense amplifier reads a data value and the decoupling device decouples the sense amplifier from a power supply during a read operation.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

A noise tolerant single-ended sense circuit, hereinafter referred to as the noise tolerant sense circuit, can be implemented in a memory such as read only memory (ROM), static random access memory (SRAM), and dynamic random access memory (DRAM). Devices that can implement the memory having the noise tolerant sense circuit include, but are not limited to, set-top boxes, computing devices, televisions, mobile phones, laptops, personal digital assistants (PDAs), and so on. These devices can be employed in a variety of applications, such as streaming, conferencing, data processing, and surveillance applications.

The noise tolerant sense circuit can be used to prevent an unreliable read operation in the memory due to the noise in the power supply and without putting an additional space constraint on a memory chip. Additionally, there is no or minimal effective increase in power consumption due to the noise tolerant sense circuit.

Figure 1:
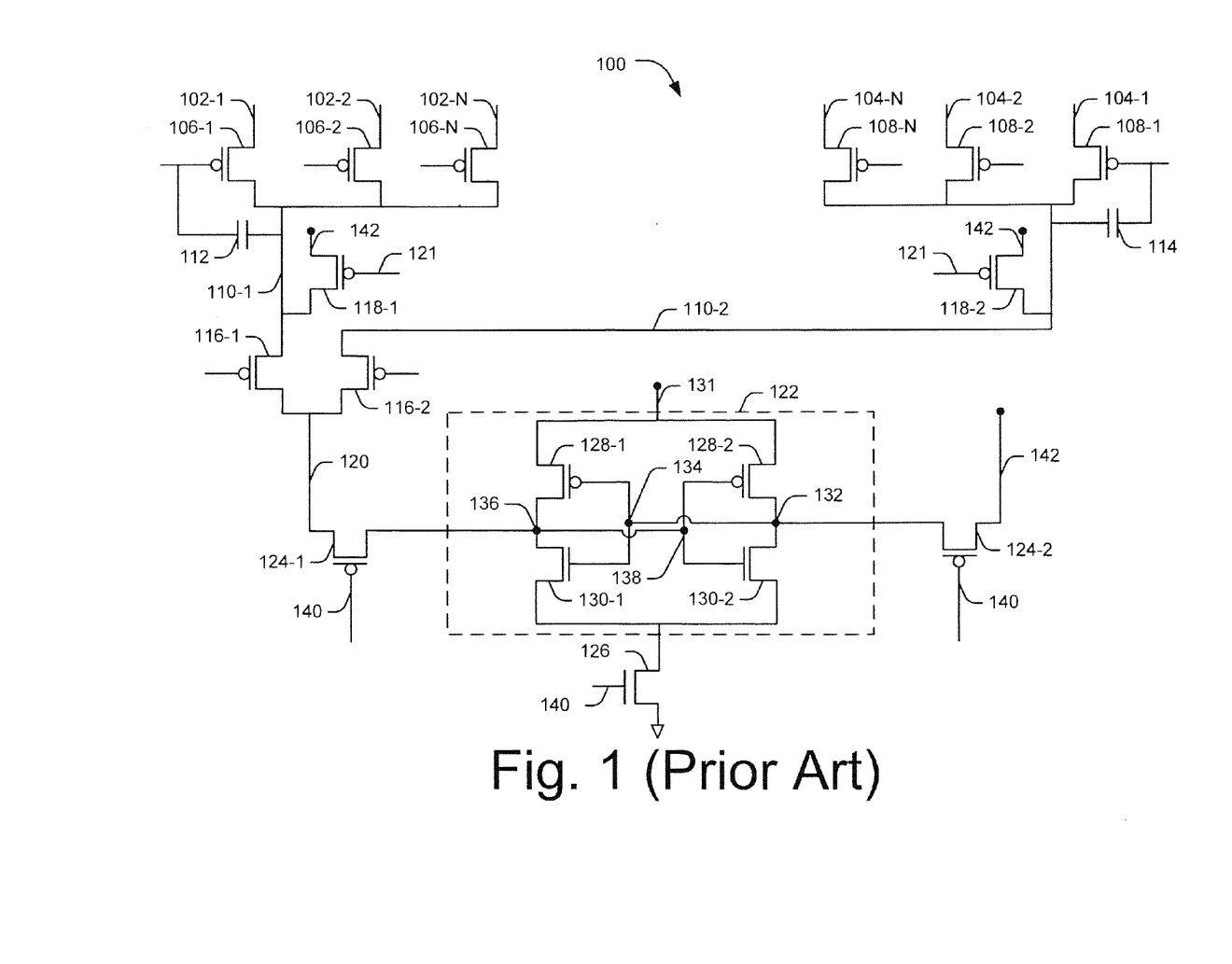
FIG. 1 illustrates a typical single-ended sense circuit for a memory.

FIG. 1 illustrates a typical single-ended sense circuit 100 for a memory. The single-ended sense circuit 100 includes a first set of primary bit lines 102-1, 102-2, . . . , 102-N, collectively referred to as primary bit lines 102; and a second set of primary bit lines 104-1, 104-2, . . . , 104-N, collectively referred to as primary bit lines 104.

The single-ended sense circuit 100 also includes a first set of pass transistors and a second set of pass transistors. The first set of pass transistors are implemented using p-channel MOSFETs 106-1, 106-2, . . . , 106-N, hereinafter collectively referred to as pMOSs 106. Drains of the pMOSs 106 are coupled to the primary bit lines 102. Similarly, the second set of pass transistors are implemented using pMOSs 108-1, 108-2, . . . , 108-N, hereinafter collectively referred to as pMOSs 108. Drains of the pMOSs 108 are coupled to the primary bit lines 104.

The sources of the pMOSs 106 and 108 can be multiplexed to provide corresponding secondary bit lines 110-1 and 110-

2, collectively referred to as secondary bit lines 110. The secondary bit line 110-1 is coupled to a source of one of the pMOS 106, for example, the pMOS 106-1. Due to an inherent capacitive coupling between the gate and the source of a typical pMOS. In the present case, a parasitic capacitance $C_{GS1}$ 112 is induced between gate of the pMOS 106-1 and the secondary bit line 110-1. Similarly, a parasitic capacitance $C_{GS2}$ 114 is induced between the gate of the pMOS 108-1 and the secondary bit line 110-2.

The single-ended sense circuit 100 also includes a third set of pass transistors implemented using pMOSs 116-1 and 116-2 and pre-charge devices realized using pMOSs 118-1 and 118-2, collectively referred to as pMOSs 118. The secondary bit line 110-1 is coupled to a drain of the pMOS 116-1 and a source of the pMOS 118-1, while the secondary bit line 110-2 is coupled to a drain of the pMOS 116-2 and a source of the pMOS 118-2. Sources of the pMOSs 116-1 and 116-2 are multiplexed to provide a tertiary bit line 120, hereinafter referred to as bit line 120. Further, the pMOSs 118 are supplied with control signals 121, such as pre-charge signals, at their gates for operation.

The single-ended sense circuit 100 further includes a single-ended sense amplifier 122, hereinafter referred to as sense amplifier 122; sense amplifier pass transistors implemented using pMOSs 124-1 and 124-2; and an n-channel MOSFET 126, hereinafter referred to as nMOS 126. The sense amplifier 122 is similar to a latch circuit and can be realized using two cross-coupled complementary metal oxide semiconductor (CMOS) inverters.

A first CMOS inverter is implemented using a pMOS 128-1 and an nMOS 130-1 and a second CMOS inverter is implemented using a pMOS 128-2 and an nMOS 130-2. Drains of the pMOSs 128-1 and 128-2 are coupled to each other and to a supply voltage Vs 131. Drains of the nMOSs 130-1 and 130-2 are also coupled to each other but are grounded via the nMOS 126.

Sources of the pMOS 128-2 and the nMOS 130-2 are coupled to each other at a first sensing node 132, hereinafter referred to as sense amplifier false (SAF) node 132. The SAF node 132 is further coupled to a source of the pMOS 124-2 and to gates of the pMOS 128-1 and the nMOS 130-1 at a node 134, hereinafter referred to as first input node 134.

Similarly, sources of the pMOS 128-1 and the nMOS 130-1 are coupled to each other at a second sensing node 136, hereinafter referred to as sense amplifier true (SAT) node 136. The SAT node 136 is coupled to the bit line 120 through the pMOS 124-1. In particular, the SAT node 136 is coupled to a source of the pMOS 124-1 and a drain of the pMOS 124-1 is coupled to the bit line 120. The SAT node 136 is also coupled to gates of the pMOS 128-2 and the nMOS 130-2 at a node 138, hereinafter referred to as a second input node 138. It is to be noted that the sense amplifier 122 is an unbalanced sense amplifier in which the size of the nMOS 130-2 is greater than that of the nMOS 130-1.

Further, gates of the pMOSs 124-1, 124-2, and the nMOS 126 are coupled to a control signal 140, while a power supply 142, hereinafter referred to as VDD 142, is applied at drains of the pMOSs 118 and 124-2. The VDD 142, when at the drain of the pMOS 124-2, acts as a reference voltage for a voltage on the bit line 120. In normal state, the VDD 142 is also applied at gates of the pMOSs 106, 108, 116-1, and 116-2 through outputs of the respective multiplexer drivers (not shown in the figure).

In operation, for example, in a read '1' case, when the control signal 140 having a low voltage is applied at the gates of the pMOSs 124-1 and 124-2 and the nMOS 126, the pMOSs 124-1 and 124-2 are activated and the nMOS 126 is deactivated. Accordingly, the bit line 120 discharges to provide a low voltage on the SAT node 136 through the pMOS 124-1. The phase during which the bit line 120 discharges is called discharge phase.

It is to be noted that the read '1' case refers to an instance when a voltage level higher than the pre-charge voltage is available on a memory cell. This high voltage is replicated on an associated bit line and corresponds to data at logic level '1'. Similarly, a read '0' case refers to an instance when the data stored in the memory cell is at low voltage or logic level zero. As a result, the bit line remains at the pre-charge voltage.

Simultaneous to the appearance of the low voltage at the SAT node 136 in the read "1" case, the VDD 142 is applied at the SAF node 132 through the pMOS 124-2. Subsequently, during an evaluation phase, the control signal 140 having a high voltage is applied at the gates of the pMOSs 124-1 and 124-2 and the nMOS 126 so that the pMOSs 124-1 and 124-2 are deactivated and the nMOS 126 is activated. The evaluation phase refers to a time duration in which the sense amplifier 122 performs the read operation.

The activated nMOS 126 further activates the sense amplifier 122 to read data value in the memory cell. The sense amplifier 122 senses a differential voltage, which should be constant during the discharge and the evaluation phases, between the SAT node 136 and the SAF 132 node. The discharge phase and the evaluation phase together constitute a read operation performed by the sense amplifier 122.

During such a read or sense operation, inductive and capacitive reactance (LCR) oscillations and noise fluctuations may get coupled to the VDD 142 and can cause an unwanted change in the voltage of the VDD 142 applied at the SAF node 132. Consequently, the voltage at the SAT node 136 may also start to fluctuate on account of the inherent coupling between the SAT node 136 and the SAF node 132. As a result, the sense amplifier 122 may sense an erratic differential voltage across the SAT node 136 and the SAF node 132. This erratic differential voltage could interfere with the reliable read or sense operation of the sense amplifier 122.

Moreover, as the VDD 142 is applied to the pMOSs 106 and 108 at their respective gates through CMOS multiplexer drivers, the disturbance in the VDD 142 may also get introduced in the secondary bit lines 110 due to the parasitic capacitances $C_{GS1}$ 112 and $C_{GS2}$ 114. From the secondary bit lines 110, the disturbance may get forwarded to the SAT node 136 through the bit line 120. This may cause an unreliable differential voltage between the SAT node 136 and the SAF node 132. In this way, the oscillations or fluctuations in the VDD 142 may get transferred to the SAT node 136 and the SAF node 132 and increase susceptibility of the single-ended sense circuit 100 to failure and unreliability.

Figure 2:
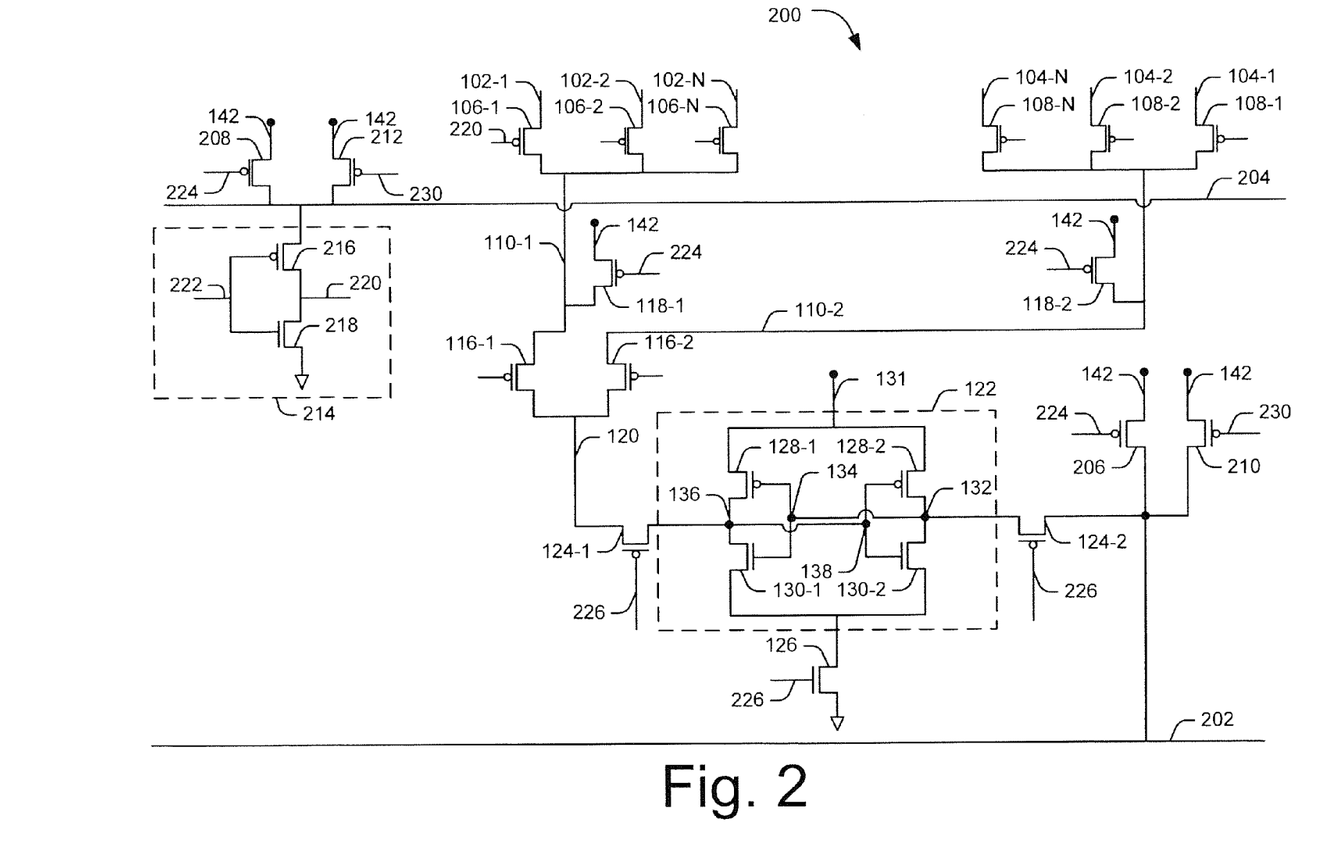
FIG. 2 illustrates an exemplary noise tolerant sense circuit for a memory, according to one embodiment of the present subject matter.

FIG. 2 illustrates an exemplary noise tolerant sense circuit for a memory, according to one embodiment of the present subject matter. The same numbers, as mentioned in FIG. 1, are used throughout FIG. 2 to reference like features and components. The components include primary bit lines 102 and 104, secondary bit lines 110, tertiary bit line 120, pass transistors 106, 108, 116, 124, and 126, pre-charge devices 118, and sense amplifier 122 having the SAT node 136 and the SAF node 132. The components individually operate in a manner as described in the description of FIG. 1. In an implementation, the sense amplifier 122 is an unbalanced sense amplifier in which the size of the nMOS 130-2 is greater than that of the nMOS 130-1.

In the embodiment, the noise tolerant sense circuit 200 further includes a first reference line 202, a second reference line 204, a first decoupling device, a second decoupling device, a first sampling device, and a second sampling device.

The first decoupling device can be implemented using a pMOS 206, while the second decoupling device can be realized with the help of a pMOS 208. The first sampling device can be implemented using a pMOS 210, while the second sampling device can be realized with the help of a pMOS 212. The first reference line 202 can be coupled to sources of the pMOSs 206 and 210 and the drain of the pMOS 124-2. The second reference line 204 can be coupled to sources of the pMOSs 208 and 212.

The noise tolerant sense amplifier 200 further includes a first set of complementary metal oxide semiconductor (CMOS) multiplexer drivers in which each CMOS multiplexer driver, for example, a CMOS inverter circuit 214, provides an output that is applied at the corresponding gates of the pMOSs 106 and 108. In an implementation, the CMOS inverter circuit 214, realized with the help of a pMOS 216 and an nMOS 218, can provide an output signal 220 as input to the drain of the pMOS 106-1.

The first set of CMOS multiplexer drivers are coupled to the second reference line 204 and receive input signals from a first column decoder (not shown in the figure) of the memory. In said implementation, the CMOS inverter circuit 214 is coupled to the second reference line 204 and receives an input signal 222 from the first column decoder. The power supply 142, hereinafter referred to as VDD 142, is applied at the drains of the pMOSs 118, 206, 208, 212, and 210. The supply voltage Vs 131 is applied to the sense amplifier 122 as described in the description of FIG. 1.

Similarly, a second set of multiplexer drivers (not shown in the figure) can provide input signals to the gates of the pMOSs 116-1 and 116-2. The second set of multiplexer drivers can be provided with input signals from a second column decoder (not shown in the figure). However, these multiplexer drivers are not coupled to the second reference line 204.

Generally, a clock generation circuitry (not shown in the figure) provides two alternate clock signals: PCH_SEN_ON signal and PCH_SEN_OFF signal. The rising edge of the PCH_SEN_ON signal refers to a pre-charge ON signal and the falling edge of the PCH_SEN_ON signal corresponds to a sense ON signal. Similarly, the rising edge of the PCH_SEN_OFF signal refers to a pre-charge OFF signal and the falling edge of the PCH_SEN_OFF corresponds to the sense OFF signal. The pre-charge ON signal and the pre-charge OFF signal, collectively referred to as pre-charge signals 224, are applied to the pMOSs 118. The sense ON signal and the sense OFF signal, collectively referred to as sense signals 226, are applied to the pMOSs 124-1 and 124-2, collectively referred to as pMOSs 124, and to the nMOS 126.

In an implementation, the order in which these signals are applied is the pre-charge ON signal, the pre-charge OFF signal, the sense ON signal, and the sense OFF signal. The order of application of these signals is controlled by the clock generation circuitry. In an example, the pre-charge ON signal has a low voltage, the pre-charge OFF signal has a high voltage, the sense ON signal has a high voltage, and the sense OFF signal has a low voltage.

In operation, the pre-charge signals 224, which include the pre-charge ON signal and the pre-charge OFF signal, are applied at the gates of the pMOSs 118, 208, and 206. The pre-charge ON signal, having a low voltage, activates the pMOSs 118, 208, and 206. Accordingly, the first reference line 202, the second reference line 204, and the secondary bit lines 110 are pre-charged. When the sense OFF signal in the sense signals 226 is applied at the gates of the pMOSs 124 and nMOS 126, the pMOSs 124 are activated while the nMOS 126 is deactivated.

To activate a particular bit line amongst the primary bit lines 102 and 104, a multiplexer driver corresponding to the particular bit line is activated. For example, in order to activate the primary bit line 102-1, the CMOS inverter circuit 214 is activated based on an input signal from the first column decoder, such as the input signal 222, and the VDD 142 from the second reference line 204. Simultaneously, the second set of multiplexer drivers can be activated to either activate the pMOS 116-1 or the pMOS 116-2 to activate the corresponding secondary bit lines 110. Accordingly, the bit line 120 is activated.

Subsequent to activation of the bit line 120, the pre-charging of the first reference line 202, the second reference line 204, and the secondary bit lines 110 is stopped by applying a pre-charge OFF signal at the gates of the pMOSs 118, 208, and 206. Depending on the presence of data on the activated bit line, such as the bit line 102-1, the bit line 120 discharges. For example, in the read '1' case corresponding to the presence of data on the bit line 120, the bit line 120 discharges, otherwise the bit line 120 remains at voltage of the VDD 142. The voltage of the bit line 120 appears at the SAT node 136 of the sense amplifier 122 and the VDD 142 is applied as a reference voltage at the SAF node 132 of the sense amplifier 122 from the first reference line 202 through the pMOS 124-2.

To perform a read operation, the clock generation circuitry generates the sense ON signal having a high voltage at the sense signal 226. This signal is applied at the gates of the pMOSs 124 and the nMOS 126 so that the pMOSs 124 are deactivated while the nMOS 126 is activated. Accordingly, the sense amplifier 122 is activated to perform the read operation.

Since the pMOS 206 was deactivated before the read operation by the pre-charge OFF signal applied as the pre-charge signal 224, the VDD 142 is decoupled from the first reference line 202. As a result, disturbance or fluctuation in the VDD 142 gets decoupled from the SAF node 132 of the sense amplifier 122. However, this decoupling of the VDD 142 from the SAF node 132 may reduce the capacitance at the SAF node 132. Consequently, once a bit line such as bit line 120 discharges, a coupling between the SAT node 136 and the SAF node 132 can decrease the voltage at the SAF node 132, which is required to be constant. Such decrease in the voltage at the SAF node 132 hampers the stable operation of the sense amplifier 122. To resolve this issue, a large capacitor can be coupled with the SAF node 132. However, addition of a large capacitor cannot be located locally with a single input and output (IO) unit including a sense amplifier, multiplexer drivers, etc., due to space constraints.

In an implementation, the first reference line 202 is shared across various IO units of the memory to increase capacitance of the first reference line 202. This increases the capacitance associated with the SAF node 132 in the sense amplifier 122. The sharing of the first reference line 202 between various IO units allows the first reference line 202 to be extended globally over to the control block, which will be discussed later.

In this way, a significant amount of capacitance, without any area penalty, can be contributed to the SAF node 132 through the first reference line 202. Now, a large capacitor (not shown in the figure) can also be coupled to the first reference line 202 in a control block of the memory chip to increase the capacitance of the first reference line 202. The control block has an unused area that can be used to place the large capacitor coupled to the first reference line 202. Thus, the overall capacitance of the first reference line 202 increases and by the virtue of this increase, when the pMOS 124-2 is active, i.e., during the discharge phase, the capacitance of the SAF node 132 also increases. Also, the injection of disturbances from the VDD 142 to the SAF node 132 is also controlled.

On the other hand, the SAT node 136 also suffers from the disturbances in the VDD 142 on account of coupling of the output of the multiplexer drivers, for example, the CMOS inverter circuit 214, with the pMOSs 106 and 108. Generally, the size of the pMOSs 106 and 108 is large enough to speed-up their operation. The large size of the pMOSs 106 and 108 increases the strength of coupling between the output of multiplexer drivers and the pMOSs 106 and 108. A slight disturbance in the VDD 142 can get strongly coupled to the bit lines 110, thus causing capacitance of the bit lines to build up and go out of an acceptable required range. Such capacitance, which is not within the acceptable range, can lead to improper functioning of the sense amplifier 122 during the read operation. Otherwise, in the absence of disturbances in the VDD 142, since the VDD 142 applied at the gates of the pMOSs 106 and 108 is same as the voltage level of the pre-charged secondary bit lines 110, the capacitance of the secondary bit lines 110 remains within the acceptable range.

In order to perform a reliable read operation, in an implementation, after the second reference line 204 is pre-charged and the required primary bit line, for example, the primary bit line 102-1, has been selected, the pre-charge OFF signal in the pre-charge signals 224 is applied at the gate of the pMOS 208 to deactivate the pMOS 208. Due to this, the second reference line 204 and therefore the CMOS multiplexer drivers, for example, CMOS inverter circuit 214, get isolated from the VDD 142. This blocks the disturbances in the VDD 142 from transmitting to the bit lines 102, 104, 110, and 120 and correspondingly to the SAT node 136 of the sense amplifier 122.

In this way, the capacitance of the bit lines 110 can be kept within the acceptable range as now there is no effective coupling between the bit lines 110 and the VDD 142 due to isolation of the bit lines 110 from the VDD 142. As explained for the first reference line 202, the second reference line 204 can also be extended globally across various IO units and can be taken to the control block. Also, like the first reference line 202, the second reference line 204 can be coupled to a large capacitor in the control block to increase the capacitance at the SAT node 136.

Additionally, the first reference line 202 and the second reference line 204 are charged simultaneously with the help of respective pMOSs 206 and 208. The pMOSs 206 and 208 ensure that the first reference line 202 and the second reference line 204 are pre-charged to the same voltage level. In an implementation, a matched structure of pMOSs similar to the pMOSs 208 and 206 can also be coupled to the second reference line 204 and the first reference line 202 in the control block to ensure same pre-charge level on both the first reference line 202 and the second reference line 204.

Further, the activated sense amplifier 122 senses a differential voltage across the SAT node 136 and the SAF node 132. In case there is no differential voltage across the SAT node 136 and the SAF node 132, i.e., in the read '0' case when both the SAT node 136 and the SAF node 132 are at the voltage of VDD 142, the SAF node 132 and the SAT node 136 are pulled down. The pull-down of the SAF node 132 is faster than the SAT node 136 due to greater size of the nMOS 130-2.

The SAT node 136 is now at a relatively higher voltage than the SAF node 132, which represents that the data available on the bit line 120 is at logic level zero. On the other hand, in the read '1' case, the bit line 120 discharges to conduct a low voltage at the SAT node 136. Therefore, the SAT node 136 is at a lower voltage than a voltage at the SAF node 132, which represents that the data available on the bit line is at a logic level one. Further, an output of the sense amplifier 122 is sent to an output buffer (not shown in the figure) of the memory. Subsequently, the sense OFF signal of the sense signals 226 is applied at the gate of the nMOS 126 to deactivate the sense amplifier 122 to end a read operation.

The time period after the completion of the read operation, i.e., after the application of the sense OFF signal, and before the start of the next pre-charging cycle, i.e., before the generation of the next pre-charge ON signal, is called as idle time. At the end of the idle time, the first reference line 202 and the second reference line 204 may lose their charge and may not get charged up to a required voltage level during the next pre-charging cycle. This may lead to an unreliable read operation.

In an implementation, to ensure that the first reference line 202 and the second reference line 204 remain coupled to the VDD 142 during a time interval other than during the discharge phase and evaluation phase, the pMOSs 210 and 212 can be coupled to the first reference line 202 and the second reference line 204, respectively. The pMOSs 212 and 210 are operated by a delayed sense OFF signal 230, also referred to as OFF_bb signal 230, applied at the gates of the pMOSs 212 and 210. The OFF_bb signal 230 is derived from the PCH_SEN_OFF signal provided by the clock generation circuitry.

Further, the pMOSs 212 and 210 are deactivated by the pre-charge OFF signal in the PCH_SEN_OFF signal. In this way, the first reference line 202 and the second reference line 204 can be prevented against discharging to an unacceptable voltage level during the idle time by using the respective pMOSs 210 and 212. It is to be noted that a supply voltage, for example, supply voltage Vs 131 if fluctuating in nature and applied to sense amplifier will not interfere with the read operation of the sense amplifier, provided the sense amplifier, for example, sense amplifier 122, is symmetrical in nature. When a supply voltage such as supply voltage Vs 131 is applied to both the sensing nodes such as the SAT node 136 and the SAF node 132 of the sense amplifier, then the sense amplifier is said to be symmetrical in nature.

Figure 3:
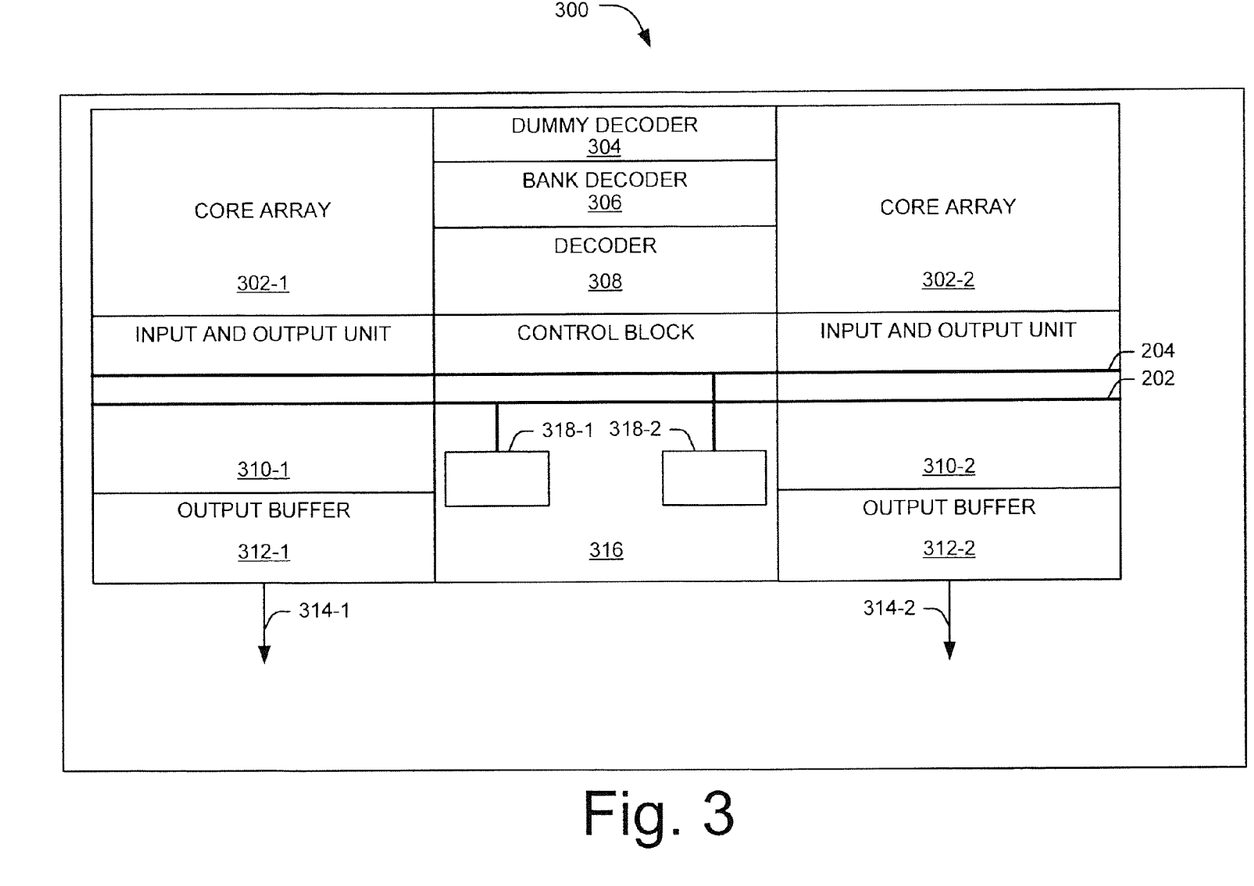
FIG. 3 illustrates an exemplary block diagram of a memory chip implementing the exemplary noise tolerant sense circuit of FIG. 2, according to one embodiment of the present subject matter.

FIG. 3 illustrates an exemplary block diagram of a memory chip 300 implementing the exemplary noise tolerant sense circuit of FIG. 2, according to one embodiment of the present subject matter. In an implementation, the memory chip 300 includes core arrays 302-1 and 302-2, a dummy decoder 304, a bank decoder 306, a decoder 308, and input-output units 310-1 and 310-2. The core arrays 302-1 and 302-2, collectively referred to as core arrays 302, include memory cells and primary bit lines, for example, the primary bit lines 102 and 104. The dummy decoder 304, the bank decoder 306, and the decoder 308 are used to access the memory cells in a way known in the art. The input-output units 310-1 and 310-2 can be collectively referred to as input-output units 310 and include various IO lines in addition to other components such as sense amplifiers, multiplexer drivers, etc.

The memory chip 300 further includes output buffers 312-1 and 312-2, output lines 314-1 and 314-2, the first reference line 202, the second reference line 204, a control block 316 including a required pre-decoder control logic, a first capacitor 318-1 and a second capacitor 318-2, collectively referred to as capacitors 318.

In the present implementation, to provide sufficient capacitance at the SAF node 132 during discharge and evaluation phases, the first capacitor or gate loading capacitor 318-1 can be coupled to the first reference line 202. It is to be noted that coupling of such a large capacitor, for example, the first capacitor 318-1, to the first reference line 202 locally with a single IO unit is restricted due to space constraints. Therefore, the first reference line 202 is extended globally across various IO units and is taken to the control block 316 where the first capacitor or gate loading capacitor 318-1 can be coupled to the first reference line 202. The placement of the first capacitor 318-1 in the control block 316 is possible on account of unused space, typically, available in the control block 316. Similarly, the second reference line 204 can also be extended globally across various IO units and can be taken to the control block 316 where the second capacitor 318-2 can be coupled to the second reference line 204.

The coupling of the large capacitors, such as the capacitors 318, to the first reference line 202 and the second reference line 204 such that the capacitors get coupled with an activated gate of a pMOS amongst pMOSs 106 and 108. Such coupling of the capacitors is known as gate loading. The gate loading increases the capacitances on both the first reference line 202 and the second reference line 204. Such an implementation assures charge holding capability of the first reference line 202 and the second reference line 204 against leakage and de-coupling of the first reference line 202 and the second reference line 204 from the VDD 142. Moreover, the first reference line 202 and the second reference line 204 are kept separate to prevent transfer of charge between the two due to charge leakage.

Figure 4:
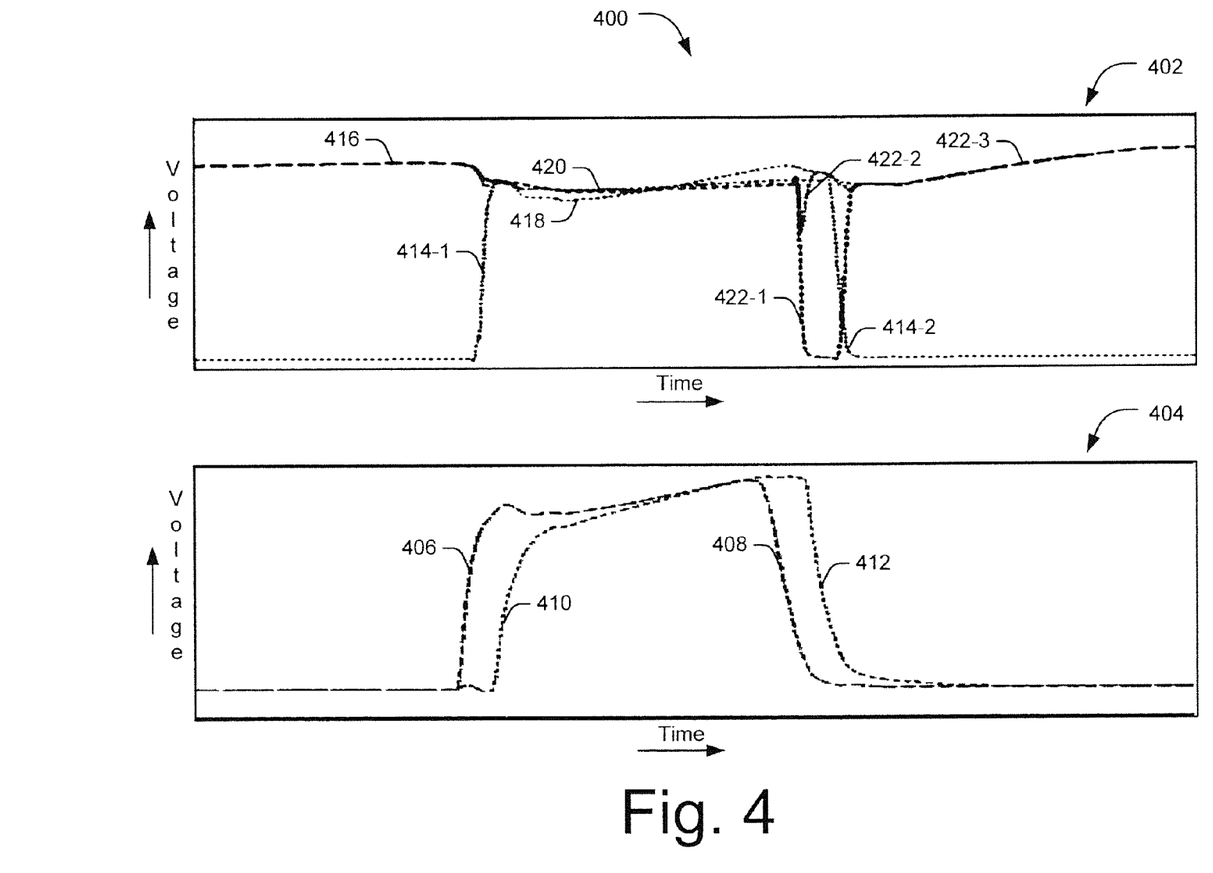
FIG. 4 illustrates an exemplary simulation result for the exemplary noise tolerant sense circuit, according to one embodiment of the present subject matter.

FIG. 4 illustrates an exemplary simulation result 400 for the exemplary noise tolerant sense circuit of FIG. 2, according to one embodiment of the present subject matter. In general, any read operation of a sense amplifier can be divided into three phases, namely a pre-charge phase, a discharge phase, and an evaluation phase. The simulation result 400 as shown represents a variation in voltage level with respect to time.

In an implementation, plot 402 corresponds to a voltage level of the bit line 120, the VDD 142, the SAT node 136, and the SAF node 132, whereas plot 404 shows corresponding voltage levels of the clock signals PCH_SEN_ON and PCH_SEN_OFF signals. The rising edge of the PCH_SEN_ON signal corresponds to the pre-charge ON signal 406, and the falling edge of the PCH_SEN_ON signal corresponds to the sense ON signal 408. Similarly, the rising edge of the PCH_SEN_OFF signal corresponds to the pre-charge OFF signal 410, and the falling edge of the PCH_SEN_OFF signal corresponds to the sense OFF signal 412.

During the pre-charge phase, the pre-charge ON signal 406 activates the pMOSs 118, 208, and 206. The pre-charge ON signal 406 thus facilitates pre-charging of the secondary bit lines 110, the first reference line 202, and the second reference line 204. At the end of the pre-charge phase, the pre-charge OFF signal 410 is applied at the gates of the pMOSs 118, 208, and 206, and this stops pre-charging of the secondary bit lines 110, the first reference line 202, and the second reference line 204. In the plot 402, the pre-charging of the secondary bit lines 110 has been shown by a line 414-1 and voltage level of the VDD 142 has been represented by a line 416. At the end of the pre-charge phase, the discharge phase begins. The discharge phase lasts for the duration between the pre-charge OFF signal 410 and the sense ON signal 408, depicted in the plot 404.

During the discharge phase, the bit line 120 is allowed to discharge through the memory cell. In this case, since a '0' value is being read, the SAF node 132 is expected to remain at VDD 142. However, during the discharge phase, the VDD 142 coupled to the SAT node 136 and the SAF node 132 can experience induced noise, which can be reduced by isolating the SAT node 136 and the SAF node 132 of the sense amplifier 122 from the VDD 142. The voltage level of the VDD 142 has been shown by line 418 in the plot 402 during the discharge phase.

Due to effective decoupling through the first and second decoupling devices 206 and 208, the SAT node 136 and the SAF node 132 can be kept at a relatively constant voltage level, as represented by line 420. The simulation result 400 clearly shows isolation of the SAT node 136 and the SAF node 132 from the fluctuating VDD 142 such that the SAT node 136 and the SAF node 132 are at a relatively constant voltage level, represented by the line 420.

After the discharge phase, the evaluation phase begins. The evaluation phase is the phase between the sense ON signal 408 and the sense OFF signal 412 in the plot 404. The sense ON signal 408 activates the nMOS 126. Accordingly, the sense amplifier 122 is activated and depending on the voltage level at the SAT node 136 and the SAF node 132, the sense amplifier 122 either senses a logic level '1' or a logic level '0'. As shown, even during the evaluation phase, the voltages of the bit line 120 and differential voltages appearing at the SAT node 136 and the SAF node 132 are at a relatively constant value.

In a read '0' case, during the evaluation phase, the unbalanced nature of the sense amplifier 122 causes the SAF node 132 to be pulled down to a lower voltage level 422-1, while the SAT node 136, though pulled down, is at a relatively higher voltage level 422-2.

Further, as the sense OFF signal 412 deactivates the sense amplifier 122 by turning off the nMOS 126, the voltage level at the SAF node 132 rises and reaches to a voltage level of the VDD 142, as represented by line 422-3. On the other hand, since the SAT node 136 is also pulled down by the end of the evaluation phase, a voltage level at the SAT node 136 is completely pulled down as represented by a line 414-2 at the end of the evaluation phase. The simulation result 400 reinforces that effective decoupling of the sense amplifier 122 from the VDD 142 through the first reference line 202 and the second reference line 204 results in a noise-free read operation.

Although embodiments for a noise tolerant sense circuit have been described in language specific to structural features and/or methods, it is to be understood that the invention is not necessarily limited to the specific features or methods described. Rather, the specific features and methods are disclosed as exemplary implementations for the noise tolerant sense circuit.

We claim:

1. A method of controlling a sense circuit comprising a bit line coupled to a memory cell, a sense amplifier having a first sensing node coupled to a first transistor and a second sensing node coupled to a second transistor, the second sensing node coupled to the bit line through the second transistor, a power supply voltage coupled to the first sensing node through a first reference line and configured to activate the bit line through a second reference line, a first decoupling device and a first sampling device coupled to the first reference line, a second decoupling device and a second sampling device coupled to the second reference line, and an inverter coupled to the second reference line, the method comprising:

applying a pre-charge ON signal to activate the first and second decoupling devices to pre-charge the first and second reference lines, and to activate the inverter based on the power supply voltage from the second reference line to activate the bit line;

decoupling the power supply voltage from the first sensing node using the first decoupling device, and decoupling the power supply voltage from activating the bit line using the second decoupling device during a read operation of the sense amplifier in response to receiving a pre-charge OFF signal;

deactivating the first and second transistors in response to receiving a sense signal to activate the sense amplifier during the read operation; and activating the first and second sampling devices at an end of the read operation to couple the first reference line and the second reference line, respectively, to the power supply voltage until a next pre-charge ON signal.

2. The method of claim 1, wherein the first reference line is coupled to a first capacitor in a control block.

3. The method of claim 1, wherein the second reference line is coupled to a second capacitor in a control block.

4. The method of claim 1, wherein each of the first reference line and the second reference line is shared between multiple input and output units.

5. The method of claim 1, wherein the sense amplifier is a single-ended sense amplifier.

6. The method of claim 1, further comprising decoupling the first and second reference lines and the bit line from the sense amplifier in response to the sense signal.

* * * * *